(12) United States Patent
Usami

(10) Patent No.: US 8,574,469 B2
(45) Date of Patent: Nov. 5, 2013

(54) PROCESSING METHOD AND MANUFACTURING METHOD FOR OPTICAL COMPONENT

(75) Inventor: Yoshihisa Usami, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 426 days.

(21) Appl. No.: 12/867,608

(22) PCT Filed: Mar. 4, 2009

(86) PCT No.: PCT/JP2009/000968
§ 371 (c)(1),
(2), (4) Date: Aug. 13, 2010

(87) PCT Pub. No.: WO2009/113272
PCT Pub. Date: Sep. 17, 2009

(65) Prior Publication Data
US 2010/0314785 A1    Dec. 16, 2010

(30) Foreign Application Priority Data
Mar. 10, 2008 (JP) ................... 2008-059346

(51) Int. Cl.
*B29D 11/00* (2006.01)

(52) U.S. Cl.
USPC ............ 264/1.37; 205/70; 216/24; 264/2.5; 264/482; 264/219

(58) Field of Classification Search
USPC ........... 264/1.1, 2.5, 1.37, 482, 219; 430/320, 430/321; 205/70; 216/24, 26
See application file for complete search history.

(56) References Cited

U.S. PATENT DOCUMENTS

| | | | |
|---|---|---|---|
| 2002/0160312 A1 | 10/2002 | Oyake et al. | |
| 2004/0032667 A1* | 2/2004 | Gale et al. | 359/642 |
| 2004/0245669 A1 | 12/2004 | Nishi et al. | |
| 2005/0232130 A1* | 10/2005 | Oyake et al. | 369/275.4 |

FOREIGN PATENT DOCUMENTS

| | | |
|---|---|---|
| CN | 1493077 A | 4/2004 |
| CN | 1599659 A | 3/2005 |
| CN | 1866062 A | 11/2006 |
| JP | 7-205155 A | 8/1995 |
| JP | 09-115190 A | 5/1997 |

(Continued)

OTHER PUBLICATIONS

First Office Action, dated Aug. 31, 2012, issued in corresponding CN Application No. 200980107709.9, 11 pages in English and Chinese.

(Continued)

*Primary Examiner* — Mathieu D. Vargot
(74) *Attorney, Agent, or Firm* — Sughrue Mion, PLLC

(57) ABSTRACT

A processing method for a mold (1) to form a pattern of recessed portions (13) on a product forming surface (11) formed on the mold (1) includes a photoresist forming step in which a thermally deformable heat-mode photoresist layer (12) is formed on the product forming surface (11), a laser beam illumination step in which a laser beam is applied to the photoresist layer (12) by an exposure device incorporating a semiconductor laser to form a pattern of recessed portions (13), and an asperity forming step in which asperities are formed on the product forming surface (11) by making use of the pattern of recessed portions (13).

16 Claims, 7 Drawing Sheets

(56) References Cited

FOREIGN PATENT DOCUMENTS

| JP | 2001-001657 A | | 1/2001 |
|----|---------------|---|--------|
| JP | 2003-311831 | * | 11/2003 |
| JP | 2006-171219 A | | 6/2006 |
| JP | 2007-216263 A | | 8/2007 |
| JP | 2007-242183 A | | 9/2007 |

OTHER PUBLICATIONS

The Second Office Action, dated Jan. 29, 2013, issued in corresponding CN Application No. 200980107709.9, 11 pages in English and Chinese.

* cited by examiner (a)

(b)

(a)

(b)

(a)

(b)

(c)

(a)

(b)

(c)

(a)

(b)

US 8,574,469 B2

PROCESSING METHOD AND MANUFACTURING METHOD FOR OPTICAL COMPONENT

CROSS REFERENCE TO RELATED APPLICATIONS

This application is a National Stage of International Application No. PCT/JP2009/000968 filed Mar. 4, 2009, claiming priority based on Japanese Patent Application No. 2008-059346 filed Mar. 10, 2008, the contents of all of which are incorporated herein by reference in their entirety.

TECHNICAL FIELD

The present invention relates to a processing method and a manufacturing method for a mold on which fine recessed portions are formed.

BACKGROUND ART

Optical plastic lenses are manufactured with high productivity by injecting resins into a mold. The surface reflection of an optical lens occurs at a high rate reaching a few or several percents; to avoid this, an optical thin film used to be formed by vacuum film forming or the like to thereby attain the reflection preventing effect. However, this method using the vacuum film forming involves reversing the lens after completion of forming a film on a front side thereof, and then forming a film on a back side thereof, which thus presents a problem of requiring much time.

To address this problem, in recent years, a principle of a photonic crystal which may be formed on a surface of a lens by providing fine asperities thereon and by which the surface reflection is reduced has been a focus of study. Among conceivable methods for forming fine asperities on a surface of a lens is a method which includes forming fine asperities on a cavity (hereinafter referred to also as "product forming surface") of a mold, performing injection molding using this mold, and thereby transferring the fine asperities to the surface of the lens.

As such a method for forming fine asperities on a product forming surface of a mold, conventionally, several methods are known in the art, such as a method which includes forming fine asperities on a surface of a lens using an electrical discharge machining (e.g., see Patent Document 1). On the other hand, a method in which an object to be processed (composed of a heat reactive substrate) is illuminated with a laser beam so that fine asperities are formed is conventionally known in the art (see Patent Document 2), though this method is not a method for forming fine asperities on a product forming surface of a mold.

RELATED ART DOCUMENTS

Patent Document 1: JP 7-205155 A
Patent Document 2: JP 2007-216263 A

However, the width of a recessed portion which can be formed by the electrical discharge machining as disclosed in Patent Document 1, or the like is limited to a few or several micrometers, and thus the methods like this disadvantageously could not form fine recesses of 1 micrometer or smaller (e.g., submicron in size).

Another method may be conceivable in which a short wavelength laser beam is emitted from a laser to illuminate a product forming surface of a mold therewith so that fine recesses are formed; however, in order to apply heat sufficient to enable metal processing to the product forming surface, a longer laser beam, for example, having a wavelength of about 10 micrometers should be required, and it should thus be deemed difficult to form fine asperities submicron in size by this method.

Accordingly, it is desired to provide a processing method and a manufacturing method for a mold, by which fine recessed portions can be formed on a product forming surface provided on the mold.

DISCLOSURE OF INVENTION

A processing method for a mold according to one aspect of the present invention comprises a photoresist forming step of forming a thermally deformable heat-mode photoresist layer on a product forming surface which includes a curved surface and which is formed on the mold; a laser beam illumination step of applying a laser beam to the photoresist layer by an exposure device incorporating a semiconductor laser to form a pattern of recessed portions; and an asperity forming step of fowling asperities on the product forming surface by making use of the pattern of recessed portions.

With the above-described method, when a laser beam is applied to a thermally deformable heat-mode photoresist layer, portions illuminated therewith (and each having a diameter a notch smaller than a spot size of the laser beam) are dissipated and fine recessed portions are formed on the photoresist layer. Accordingly, asperities may be formed on the product forming surface, for example by etching or the like, by making use of such a pattern of recessed portions as formed by application of the laser beam to the photoresist layer, so that even fine asperities (e.g., asperities submicron in size) can be formed adequately. Since the wavelength of a typically used semiconductor laser is 405 nm or so at the shortest, it cannot form so fine asperities as a solid-state laser having a shorter wavelength can; however, the use of a thermally deformable heat-mode photoresist layer enables the semiconductor laser to form fine asperities.

In the above-described method, the laser beam illumination step may preferably, as the case may be, but not necessarily, include changing an orientation of a head emitting the laser beam, in accordance with an angle of the product forming surface, so as to make a surface of the photoresist layer covering the product forming surface and an optical axis along which the laser beam travels perpendicular to each other.

On example of applicable methods for controlling the orientation of the head may be such that information as to the shape of a workpiece is obtained in advance and the optical axis of a processing laser is controlled in accordance with this information. The method of obtaining the information may include a method of acquiring the shape as specified in its mechanical design, or a shape detection device may be used. The shape detection devices which may be applied thereto include a laser displacement sensor or a contact displacement sensor. The laser displacement sensor is of a non-contact type and thus preferable in that there is no potential to cause flaws or other defects on a workpiece. The method using a laser displacement sensor can obtain information simultaneously with the processing so that the control can be exercised in real time.

With this feature, the surface of the photoresist layer over the product forming surface is made perpendicular to the optical axis along which the laser beam travels, and thus a position of a focal point of the laser beam emitted from the head can be set accurately at a predetermined position in the photoresist layer, with the result that a desirable pattern of recessed portions can be formed on the photoresist layer.

In the above-described method, the asperity forming step may include: forming a film of metal material on the product forming surface and an outer surface of the photoresist layer, and thereafter removing the photoresist layer, to thereby form the asperities on the product forming surface.

With this feature, a fine pattern of asperities can be formed adequately on the product forming surface of the mold by means of the metal pattern.

In the above-described method, the asperity forming step may include: putting the mold into a plating bath, letting a plating film grow on the product forming surface, and thereafter removing the photoresist layer, to thereby form the asperities on the product forming surface.

With this feature, a fine pattern of asperities can be formed adequately on the product forming surface of the mold by utilizing a pattern of the plating film.

In the above-described method, the asperity forming step may include: etching using as a mask the photoresist layer remaining on the product forming surface, and thereafter removing the photoresist layer, to thereby form the asperities on the product forming surface.

With this feature, a fine pattern of asperities can be formed adequately on the product forming surface of the mold through etching.

In the above-described method, the asperity forming step may include: forming a film of metal material continuously on the product forming surface and an outer surface of the photoresist layer to thereby form the asperities on the product forming surface.

With this feature, a metal pattern of asperities can be formed adequately merely by forming the film of metal material continuously on the product forming surface of the mold and the photoresist layer remaining on the product forming surface. Moreover, this method does not need to remove the photoresist layer after forming the film of metal material, and thus obviates the need for equipment or the like for removing the photoresist layer, so that the manufacturing cost can be reduced.

In the above-described method, the laser beam illumination step may include: exercising a focus servo control such that the laser beam is focused on a predetermined position relative to the photoresist layer.

With this feature, the laser beam can be focused on the predetermined position relative to the photoresist layer, and thus a spot size of the laser beam applied to the surface of the photoresist layer can be made uniform, so that recessed portions can be formed uniformly.

In the above-described method, the laser beam illumination step may include: causing a movement of a head emitting the laser beam and the mold relative to each other to be made along the recessed product forming surface.

With this feature, the distance between the head and the photoresist layer can be kept constant, and thus a spot size of the laser beam applied to the surface of the photoresist layer can be made uniform, so that recessed portions can be formed uniformly.

In the above-described method, it is particularly advantageous that the pattern of recessed portions has widths of 1 micrometer or less. That is, by making use of a pattern of recessed portions formed by application light to a thermally deformable heat-mode photoresist layer, the pattern of recessed portions having widths of 1 micrometer or less (e.g., submicron in size), which was difficult to form according to the conventional art, can be formed adequately.

The above-described processing method may be utilized for a manufacturing method for a mold. Furthermore, an optical component may be manufactured by injection molding using a mold manufactured by this manufacturing method. With this method, for example, a pattern of asperities submicron in size formed on a product forming surface of a mold can be transferred to an optical component, so that optical components having a pattern of asperities submicron in size can be manufactured adequately and easily.

According to the embodiments of the present invention, as will be described later, a fine pattern of recessed portions can be adequately formed on a product forming surface of a mold by application of a laser beam to a thermally deformable heat-mode photoresist layer. The above aspects and advantages, other advantages and further features of the present invention will be more apparent by a detailed description of illustrative, non-limiting embodiments of the present invention, which will be given below with reference to the accompanying drawings.

MODE(S) FOR CARRYING OUT THE INVENTION

Figure 1:
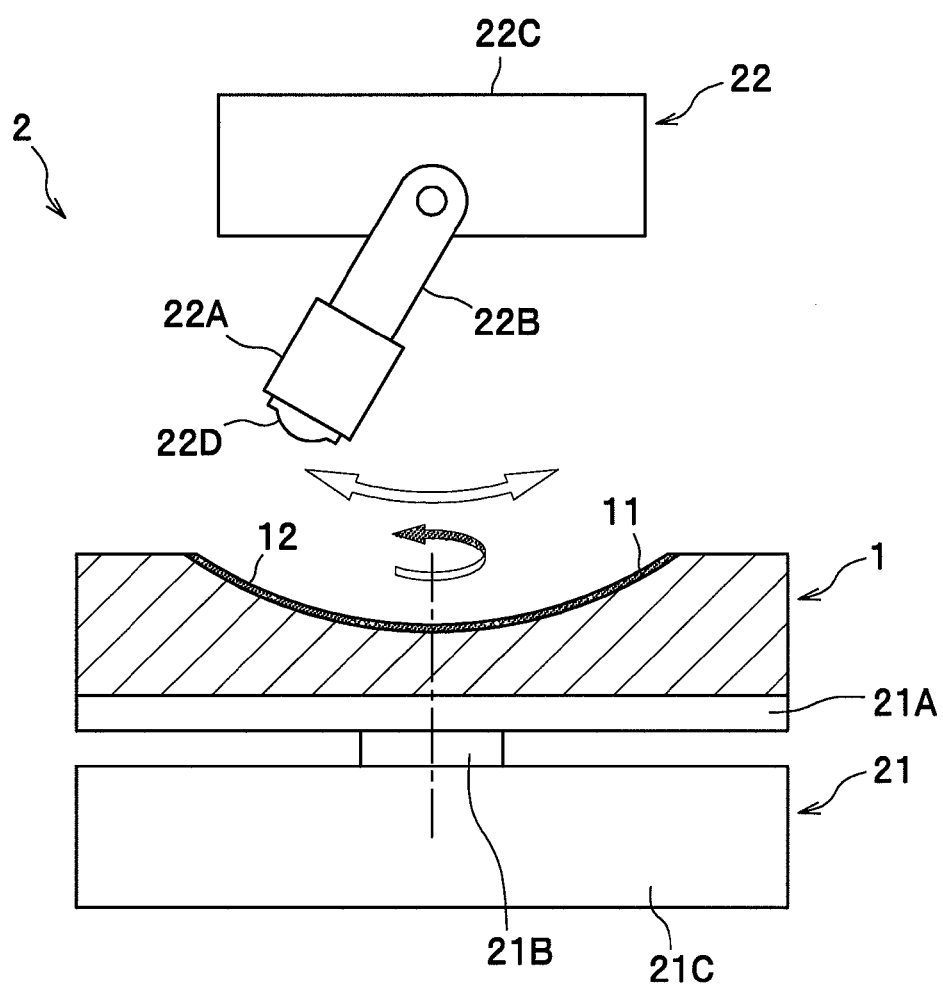
FIG. 1 is a side view showing a processing device for a mold according to one embodiment of the present invention.

Next, one embodiment of the present invention will be described in detail with reference made to the drawings where appropriate.

First, referring to FIG. 1, a description will be given of a processing device 2 for forming a pattern of recessed portions 13 (see FIG. 2 (a)) on a concave product forming surface 11 (specifically, a photoresist layer 12) formed on a mold 1. In the present embodiment, the concave product forming surface including a (spherically) curved surface is adopted, but the present invention is not limited to this configuration; it may include any surface inclined at an angle to a mating surface of the mold, for example, a truncated conical surface.

A shown in FIG. 1, the processing device 2 includes a rotator 21 for rotating a mold 1, and an exposure device 22 incorporating a semiconductor laser. The rotator 21 includes a rotatory table 21A for supporting a mold 1, a support shaft 21B for supporting the rotatory table 21B, and a driving device 21C for causing the support shaft 21B to rotate.

The exposure device 22 includes a small-sized head 22A incorporating a semiconductor laser for emitting a laser beam, a support arm 22B for supporting the head 22A, and a driving device 22C configured to swing the support arm 22B to thereby cause a lens surface 22D of the head 22A to move along the product forming surface 11 (a surface of the photoresist layer 12).

To be more specific, the driving device 22C moves the head 22A while tilting the head 22A to keep it in alignment with the inclined product forming surface 11 so that an optical axis along which a laser beam emitted from the head 22A travels intersects substantially at right angles with a surface of a portion of the photoresist layer 12 to be worked with the laser beam applied thereto. That is, the head 22A is configured to be swingable about the center of a sphere which the product forming surface 11 is contoured to fit, so that an extension of the optical axis along which the laser beam travels always passes through that center of the spherical product forming surface 11.

The driving device 22C is configured to be movable upward and downward so that the head 22A can move toward and away from the product forming surface 11 (the surface of the photoresist layer 12) of the mold 1. Moreover, the driving device 22C includes a controller (not shown) adapted to output a signal produced based upon the pattern of recessed portions 13 (see FIG. 2 (a)) to be formed on the photoresist layer 12, to the head 22A. This controller is configured to exercise a focus servo control such that the laser beam is focused on a predetermined position relative to the photoresist layer 12 by regulating a movable optical component (e.g., an objective lens) provided in the head 22A.

<Manufacturing Method for Mold>

Next, referring to FIG. 2 (a)-(b) and FIG. 3 (a)-(b), a manufacturing method for a mold will be described.

First, known processes of casting and machining of a product forming surface 11 are carried out to fabricate a mold 1 including a spherical product forming surface 11. Thereafter, a processing method implemented according to the present invention as will be described below will be performed to manufacture the mold 1 having a fine pattern of asperities on the product forming surface 11.

The lower limit value of the radius of curvature of the concave product forming surface 11 may preferably be 25 mm or more, 50 mm or more, and 100 mm or more. This is because the product forming surface 11 having an excessively small radius of curvature would make it difficult to provide a head 22A fabricated in a size such that it can be inserted into that concave product forming surface 11. The upper limit value of the radius of curvature of the product forming surface 11 may preferably be 2 m or less, 1 m or less, and 0.5 m or less. The product forming surface 11 having an excessively large radius of curvature would make it difficult to have a macroscopic shape of the mold 1 precisely maintained, and to have the accuracy for scanning with a beam of light for exposure adequately maintained.

<Processing Method for Mold>

Figure 2:
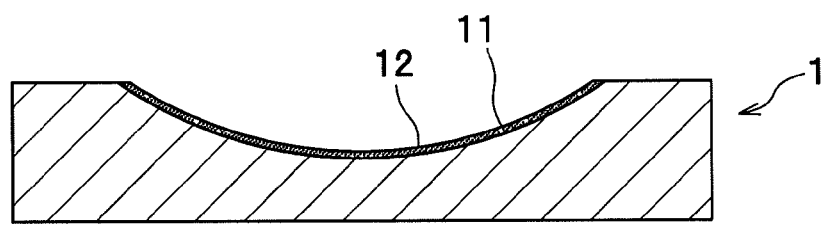
FIG. 2 includes (a) a sectional view showing a photoresist layer forming step, and (b) a sectional view showing a laser beam illumination step.
Figure 2:
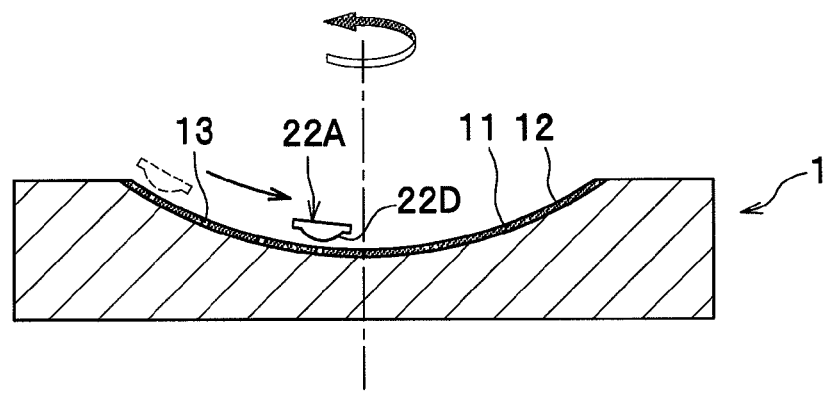

First, as shown in FIG. 2 (a), a thermally deformable heat-mode photoresist layer 12 is formed on a product forming surface 11 of a mold 1 (photoresist forming step).

The photoresist layer 12 is a layer in which a recessed portion can be formed by application of strong light, through thermal deformation of material caused by heat produced by conversion of the light applied, that is, a layer of a so-called heat mode type photoresist material. This type of photoresist material is hitherto used generally in the recording layer of optical discs or the like; for example, recording materials such as cyanine-based, phthalocyanine-based, quinone-based, squarylium-based, azulenium-based, thiol complex salt-based, and merocyanine-based recording materials may be used for our purpose.

The photoresist layer 12 according to the present invention may preferably be of a dye type, which contains a dye as a photoresist material.

Therefore, the photoresist material contained in the photoresist layer 12 may be selected from dyes or other organic compounds. It is to be understood that the photoresist material is not limited to organic material; that is, an inorganic material or a composite material of organic and inorganic materials may also be employed. With the organic materials, however, the coating process for forming a film can be performed easily by spin coating or spraying, and a material having a lower transition temperature is readily available; thus, the organic materials may be preferable. Further, amongst various organic materials, dyes whose light absorption can be controlled by varying their molecular design may be preferable.

Preferred examples of material for use in the photoresist layer 12 may include methine dyes (cyanine dyes, hemicyanine dyes, styryl dyes, oxonol dyes, merocyanine dyes, etc.), large ring dyes (phthalocyanine dyes, naphthalocyanine dyes, porphyrin dyes, etc.), azo dyes (including an azo-metal chelate dye), arylidene dyes, complex dyes, coumarin dyes, azole derivatives, triazine derivatives, 1-aminobutadiene derivatives, cinnamic acid derivatives, quinophthalone dyes, etc. Of these, methine dyes, oxonol dyes, large ring dyes and azo dyes may preferable.

This dye-type photoresist layer 12 may preferably contain a dye having absorption in the range of exposure light wavelengths. Particularly, the upper limit of an extinction coefficient k indicating the amount of light absorption may preferably be 10 or less, more preferably 5 or less, still more preferably 3 or less, and most preferably 1 or less. This is because too high extinction coefficient k would prevent light incident on one side of the photoresist layer 12 from reaching or passing through the opposite side, thus rendering the holes formed in the photoresist layer 12 uneven. On the other hand, the lower limit of the extinction coefficient k may preferably be 0.0001 or more, more preferably 0.001 or more, and still more preferably 0.1 or more. This is because too low extinction coefficient k would reduce the amount of light absorption, which would make a higher laser power necessary and reduce the production speed.

It is to be understood, as described above, that the photoresist layer 12 needs to have absorption of light in the range of exposure light wavelengths; with this in view, the selection of an appropriate dye and/or alteration of its structure may be made in accordance with the wavelength of the laser beam produced by the laser light source.

For example, in the case where the oscillation wavelength of the laser beam emitted from the laser light source is around 780 nm, it is advantageous to select dyes such as pentamechine cyanine dyes, heptamechine oxonol dyes, pentamethine oxonol dyes, phthalocyanine dyes, and naphthalocyanine dyes. Of these, phthalocyanine dyes or pentamethine cyanine dyes may be used preferably in particular.

In the case where the oscillation wavelength of the laser beam emitted from the laser light source is around 660 nm, it is advantageous to select dyes such as trimechine cyanine dyes, pentamethine oxonol dyes, azo dyes, azo-metal complex dyes, and pyrromethene complex dyes.

Further, in the case where the oscillation wavelength of the laser beam emitted from the laser light source is around 405 nm, it is advantageous to select dyes such as monomechine cyanine dyes, monomechine oxonol dyes, zero-mechine merocyanine dyes, phthalocyanine dyes, azo dyes, azo-metal complex dyes, porphyrin dyes, arylidene dyes, complex dyes, coumarin dyes, azole derivatives, triazine derivatives, benzotriazole derivatives, 1-aminobutadiene derivatives, and quinophthalone dyes.

Examples of preferred compounds for use in the photoresist layer 12 (i.e., as a photoresist material) are shown below in the cases where the oscillation wavelength of the laser beam emitted from the laser light source is around 780 nm, around 660 nm, and around 405 nm, respectively. Compounds given by (I-1) to (I-10) in the following chemical formulae 1, 2 are suitable in the case where the oscillation wavelength of the laser beam is around 780 nm. Compounds given by formulae (II-1) to (II-8) in the chemical formulae 3, 4 are suitable in the case where the oscillation wavelength of the laser beam is around 660 nm, and compounds given by (III-1) to (III-14) in the chemical formulae 5, 6 are suitable in the case where the oscillation wavelength of the laser beam is around 405 nm. It is to be understood that the present invention is not limited to the case where these compounds are used as the photoresist material.

Examples of photoresist material in the case of laser oscillation wavelength around 780 nm

[Chem. 1]

(I-1)
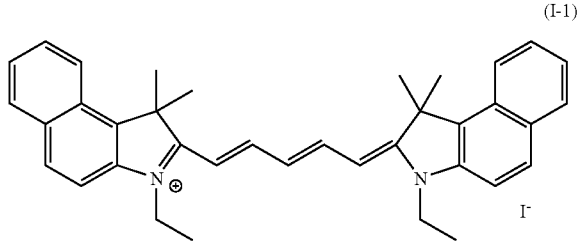

(I-2)
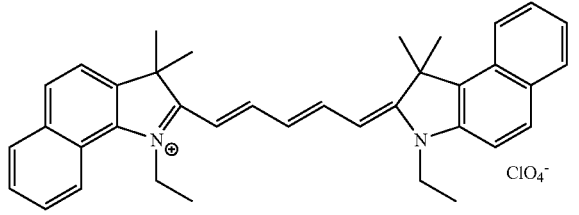

(I-3)
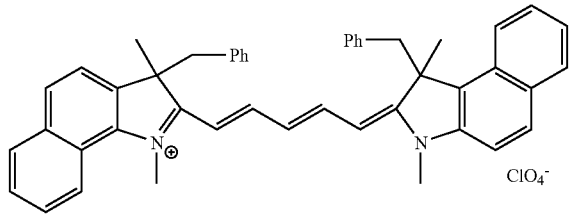

(I-4)
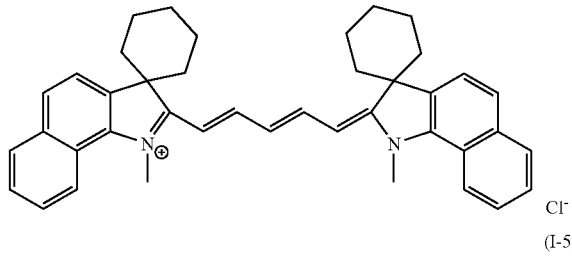

(I-5)
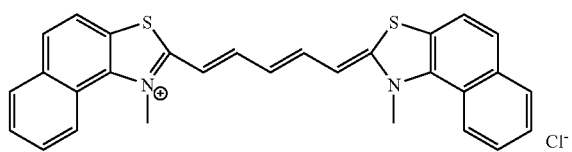

Examples of photoresist material in the case of laser oscillation wavelength around 780 nm

[Chem. 2]

(I-6)
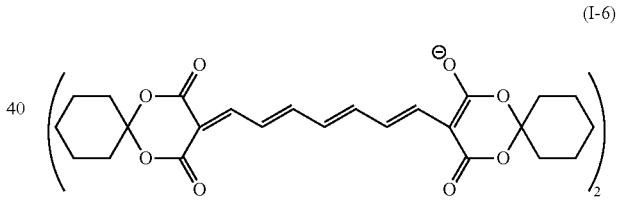

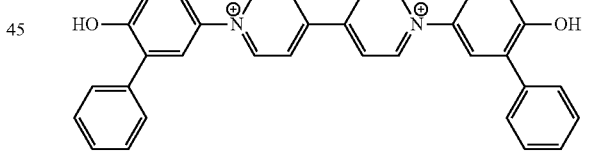

(I-7)
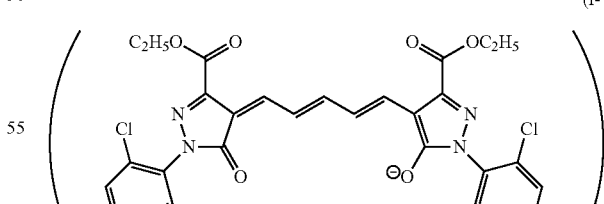

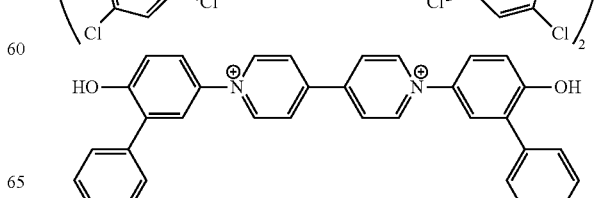

(I-8)
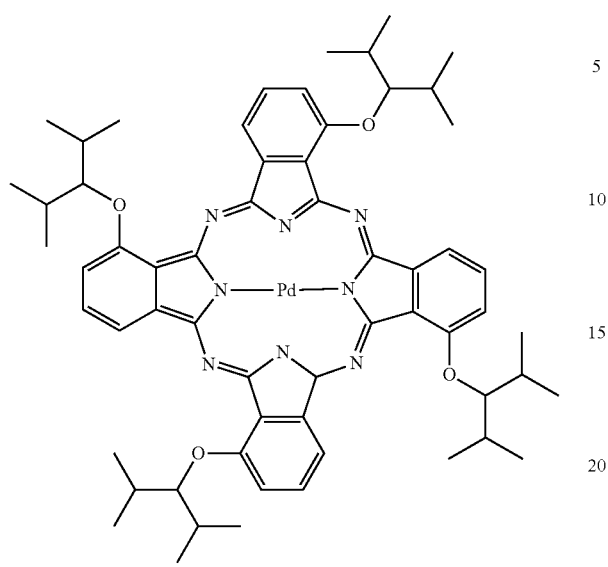
(I-9)
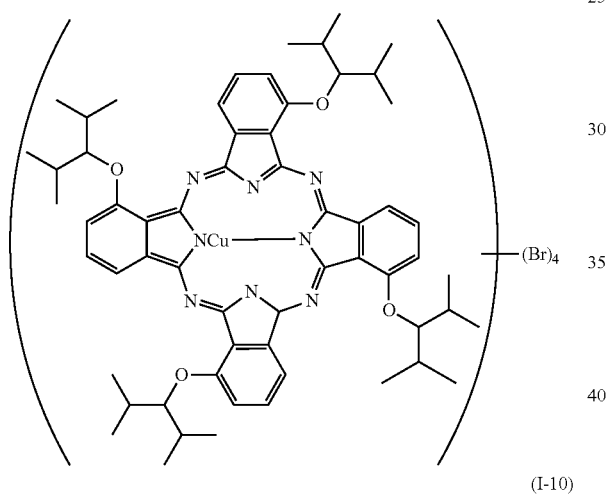(Br)₄
(I-10)
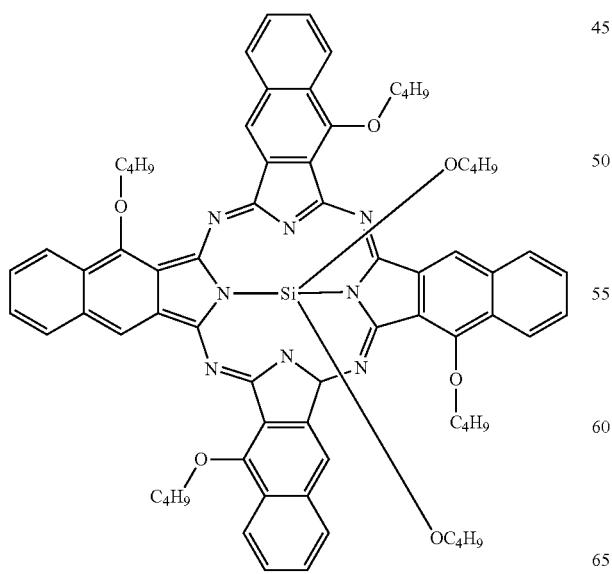
Examples of photoresist material in the case of laser oscillation wavelength around 660 nm

[Chem. 3]
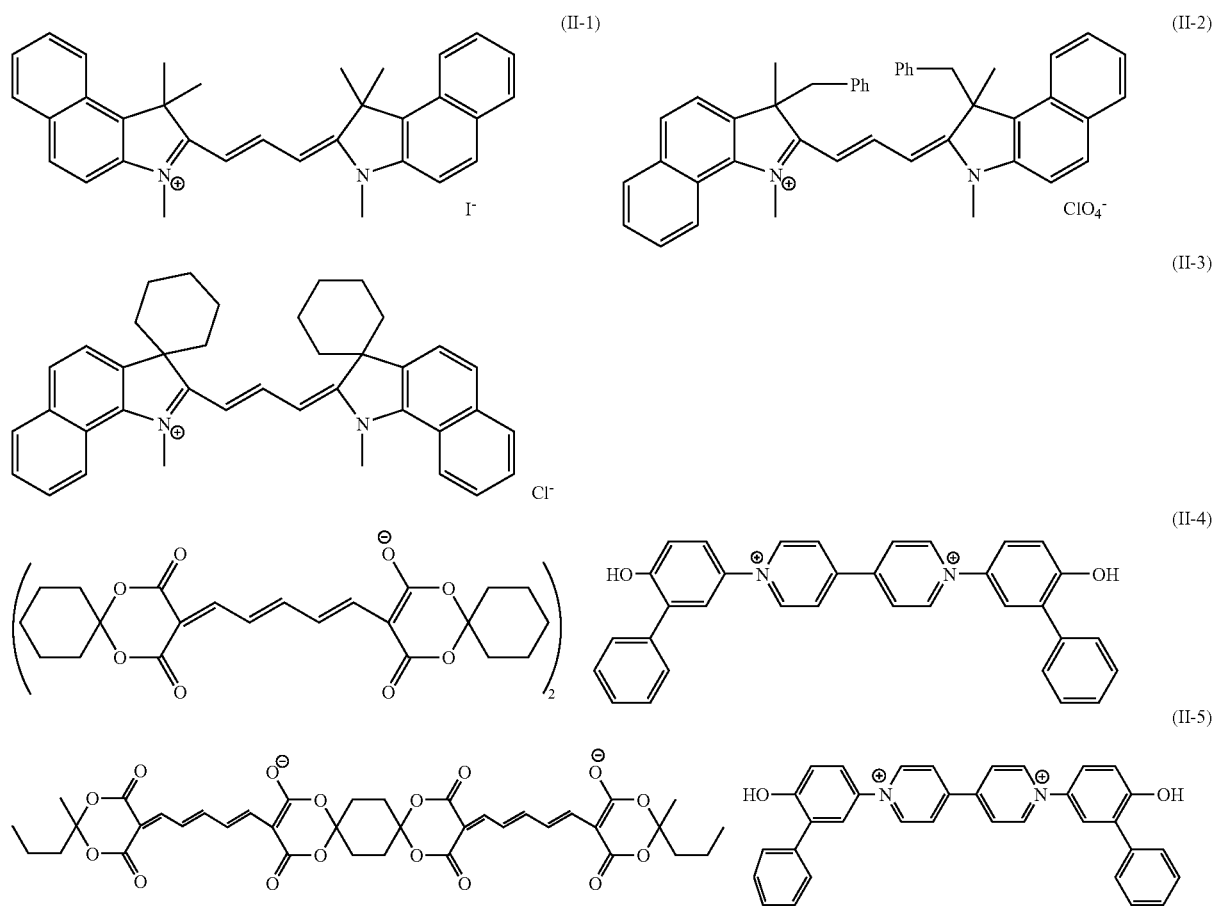
Examples of photoresist material in the case of laser oscillation wavelength around 660 nm
[Chem. 4]
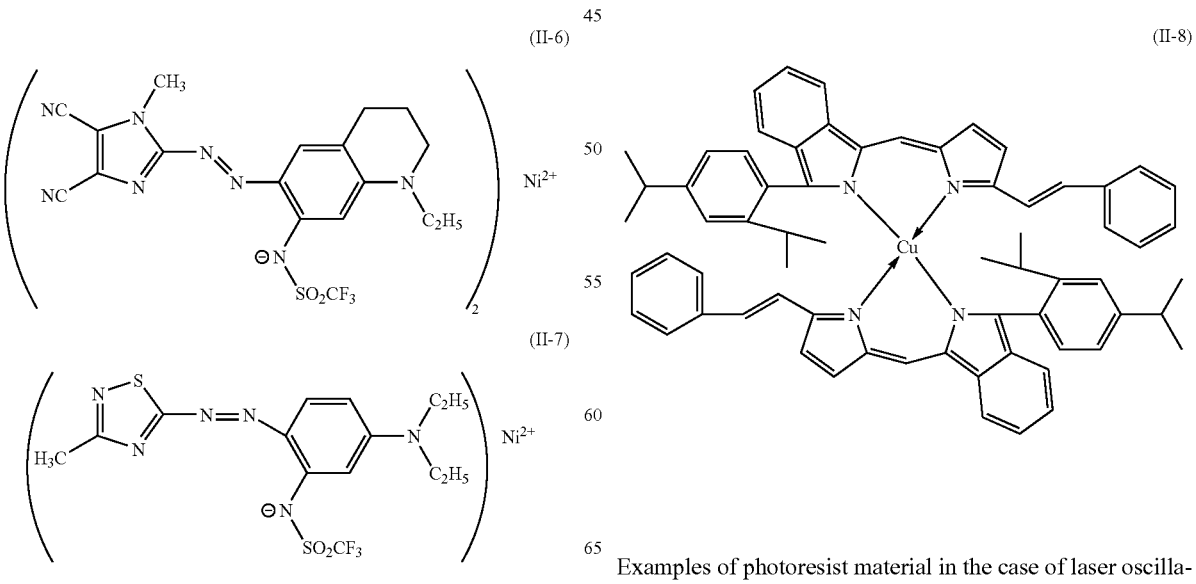
Examples of photoresist material in the case of laser oscillation wavelength around 405 nm

[Chem. 5]
(III-1)
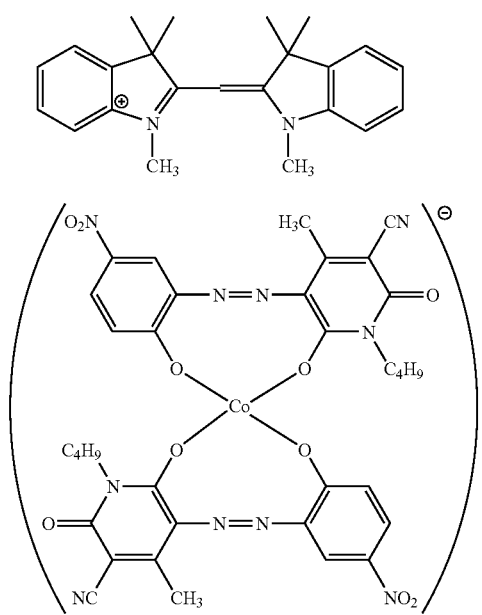
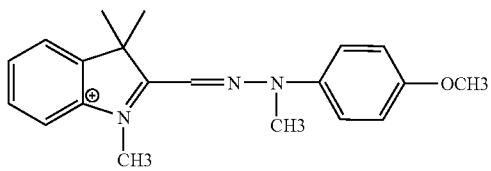
(III-2)
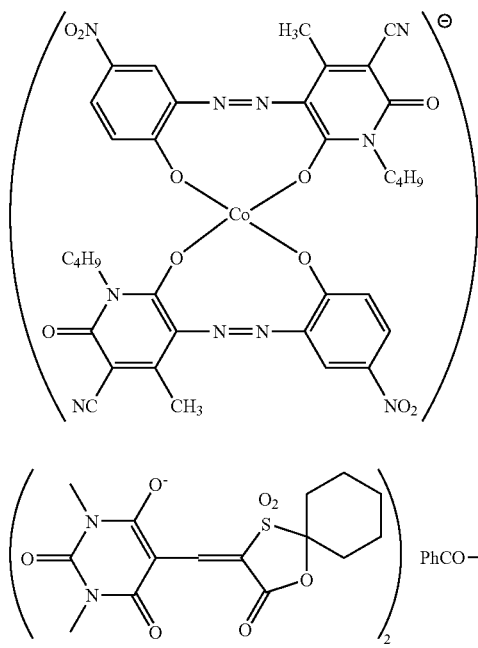
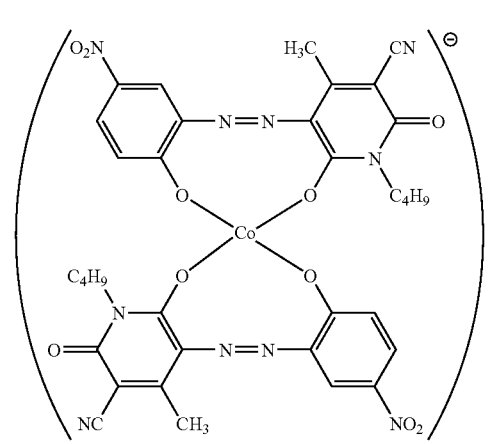
(III-3)
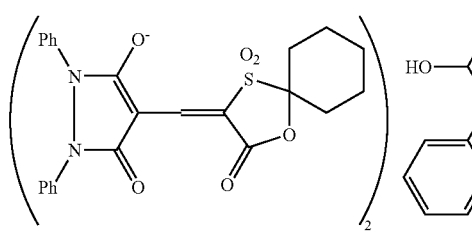
(III-4)
(III-5)
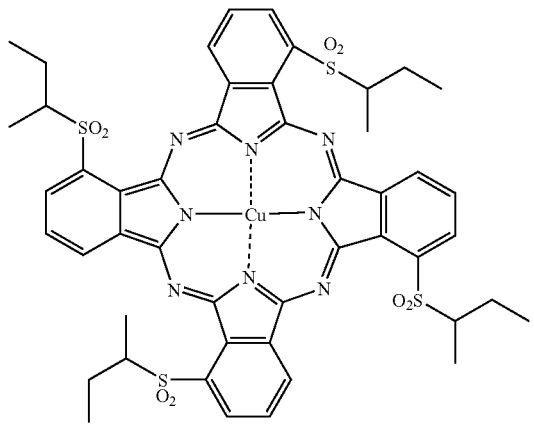
(III-6)
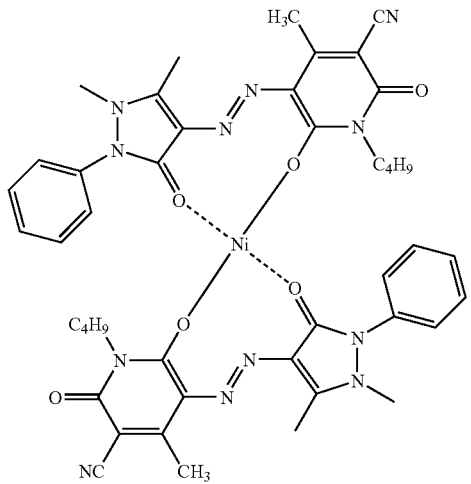

Examples of photoresist material in the case of laser oscillation wavelength around 405 nm

[Chem. 6]

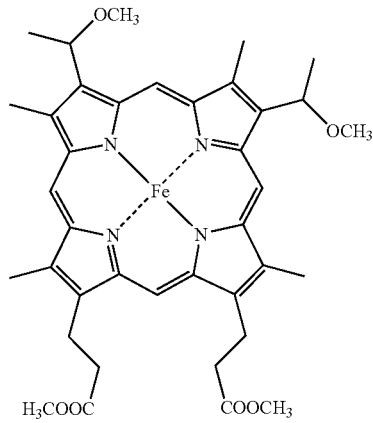
(III-7)

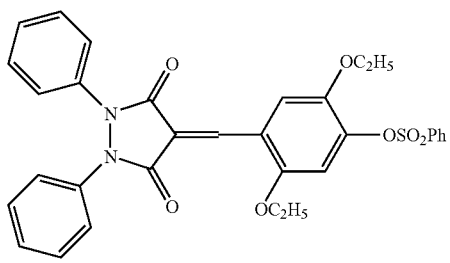
(III-8)

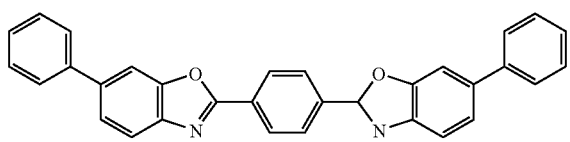
(III-9)

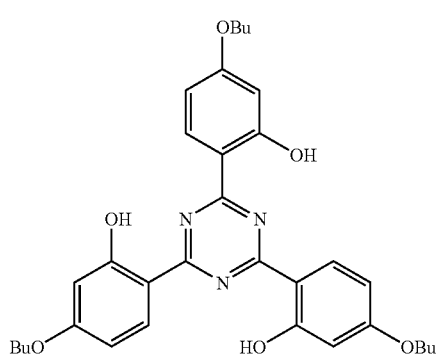
(III-10)

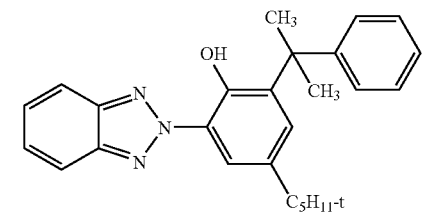
(III-11)

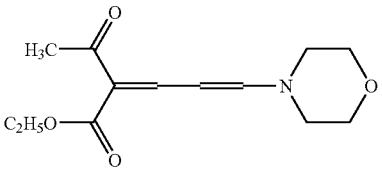
(III-12)

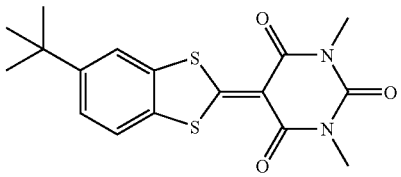
(III-13)

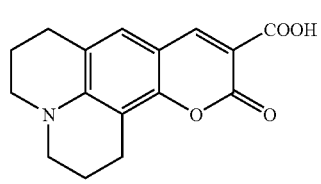
(III-14)

Dyes described in Japanese Laid-open Patent Applications, Publication (JP-A) Nos. 4-74690, 8-127174, 11-53758, 11-334204, 11-334205, 11-334206, 11-334207, 2000-43423, 2000-108513, and 2000-158818 can also preferably be used.

The dye-type photoresist layer 12 may be formed by dissolving a dye in an adequate solvent along with a binding agent to prepare a coating liquid, then applying the coating liquid on a product forming surface 11 to form a coating film, and thereafter drying the resulting coating film. In this process, the temperature of a surface on which the coating liquid is applied may preferably be in the range of 10-40 degrees centigrade. More preferably, the lower limit thereof may be 15 degrees centigrade or higher, still more preferably 20 degrees centigrade or higher, and particularly preferably 23 degrees centigrade or higher. Meanwhile, the upper limit thereof may be more preferably 35 degrees centigrade or lower, still more preferably 30 degrees centigrade or lower, and particularly preferably 27 degrees centigrade or lower. When the temperature of the coated surface is in the above ranges, uneven application of the coating and coating failure can be prevented, so that a thickness of the coating film can be made uniform.

Each of the upper and lower limits mentioned above may be arbitrarily combined with each other.

Here, the photoresist layer 12 may be either mono-layered or multi-layered. In the case of the photoresist layer 12 having a multi-layered configuration, the coating step is repeated plural times.

A concentration of the dye in the coating liquid is generally in the range of 0.01-15 mass percent, preferably in the range of 0.1-10 mass percent, more preferably in the range of 0.5-5 mass percent, and most preferably in the range of 0.5-3 mass percent.

Examples of the solvent for the coating liquid include: esters such as butyl acetate, ethyl lactate and cellosolve acetate; ketones such as methyl ethyl ketone, cyclohexanone, and methyl isobutyl ketone; chlorinated hydrocarbons such as dichloromethane, 1,2-dichloroethane and chloroform; amides such as dimethylformamide; hydrocarbons such as methylcyclohexane; ethers such as tetrahydrofuran, ethyl ether, and dioxane; alcohols such as ethanol, n-propanol, isopropanol, n-butanol, and diacetone alcohol; fluorinated solvents such as 2,2,3,3-tetrafluoropropanol; and glycol ethers such as ethylene glycol monomethyl ether, ethylene glycol monoethyl ether and propylene glycol monomethyl ether. Fluorinated solvents, glycol ethers and ketones are preferable. Particularly preferable are fluorinated solvents and glycol ethers. Further preferable are 2,2,3,3-tetrafluoropropanol and propylene glycol monomethyl ether.

Taking the solubility of the dye used in the solvents into consideration, the above solvents may be used singly or in a combination of two or more kinds thereof. Various kinds of additives such as an antioxidant, a UV absorbent, a plasticizer and a lubricant may be added in the coating liquid depending on the purpose.

Coating methods such as spray method, spin coating method, dip method, roll coat method, blade coat method, doctor roll method, doctor blade method, and screen printing method are applicable. Of these methods, the spin coating method is preferable in terms of its excellent productivity and easy controllability of the film thickness.

In order to form the photoresist layer 12 better by the spin coating method, the dye may be dissolved preferably in the organic solvent in the range of 0.3-30 weight percent, and more preferably in the range of 1-20 weight percent. It is particularly preferable that the dye be dissolved in tetrafluoropropanol in the range of 1-20 weight percent. It is also preferable that the thermal decomposition temperature of the photoresist material be in the range of 150-500 degrees centigrade, and more preferably in the range of 200-400 degrees centigrade.

The temperature of the coating liquid at the time of coating may preferably be in the range of 23-50 degrees centigrade, more preferably in the range of 24-40 degrees centigrade, and particularly preferably in the range of 25-30 degrees centigrade.

In the case where the coating liquid contains a binding agent, examples of the binding agent include natural organic polymers such as gelatin, cellulose derivatives, dextran, rosin and rubber; and synthetic organic polymers including hydrocarbonic resins such as polyethylene, polypropylene, polystyrene and polyisobutylene, vinyl resins such as polyvinylchloride, polyvinylidene chloride and polyvinylchloride-polyvinyl acetate copolymers, acrylic resins such as polymethyl acrylate and polymethyl methacrylate, and initial condensates of thermosetting resins such as polyvinyl alcohol, chlorinated polyethylene, epoxy resin, butyral resin, rubber derivatives and phenol formaldehyde resin. In the case where the binding agent is used together as a material for the photoresist layer 12, the amount of the binding agent used is generally in the range of 0.01-50 times the amount of dye (mass ratio), and preferably in the range of 0.1-5 times the amount of dye (mass ratio).

In order to increase the lightfastness of the photoresist layer 12, various antifading agents may be contained in the photoresist layer 12.

In general, a singlet oxygen quencher is used for the antifading agent. As examples of such singlet oxygen quencher, those described in published documents such as patent specifications hitherto known in the art can be used.

Specific examples of such patent specifications include: Japanese Laid-open Patent Applications, Publication (JP-A) Nos. 58-175693, 59-81194, 60-18387, 60-19586, 60-19587, 60-35054, 60-36190, 60-36191, 60-44554, 60-44555, 60-44389, 60-44390, 60-54892, 60-47069, 63-209995, and 4-25492; Japanese Examined Patent Applications, Publication (JP-B) Nos. 1-38680 and 6-26028; German Patent No. 350399; and Nippon Kagaku Kaishi, October (1992), p. 1141. The use amount of the antifading agent such as a singlet oxygen quencher relative to the amount of dye is generally in the range of 0.1-50 mass percent, preferably in the range of 0.5-45 mass percent, more preferably in the range of 3-40 mass percent, and particularly preferably in the range of 5-25 mass percent.

The photoresist layer 12 may also be formed by any film-forming method such as evaporation, sputtering and CVD, which may be selected depending on the physical properties of the material to be used therein.

The dye to be used is such that a light absorptance thereof at the wavelength of a laser beam used in the processing of a pattern of recessed portions 13 which will be described later is higher than those at the other wavelengths.

The wavelength at which the dye exhibits the peak absorption may not necessarily fall within the range of the wavelengths of visible light, but may be within the range of the wavelengths of the ultraviolet or infrared region.

The wavelength $\lambda w$ of the laser beam to be emitted to form a pattern of recessed portions 13 may be any wavelength as long as a sufficiently high laser power is obtained. For example, in the case where a dye is used for the photoresist layer 12, the wavelength may preferably be 1,000 nm or less, such as 193 nm, 210 nm, 266 nm, 365 nm, 405 nm, 488 nm, 532 nm, 633 nm, 650 nm, 680 nm, 780 nm, and 830 nm.

The laser beam may be a continuous light beam or pulsed light beam. However, it is preferable to use a laser beam whose emission intervals can be changed freely. For example, the use of a semiconductor laser is preferable. In the case where the laser beam is not directly on-off keyed, it is preferable that the laser beam is modulated using an external modulation element.

In order to increase the processing speed, a higher laser power is preferable. However, the higher the laser power, the higher scanning speed (speed for scanning the photoresist layer 12 with the laser beam; for example, rotation speed of the rotator 21 which will be described later) is required. For this reason, taking the upper limit value of the scanning speed into consideration, the upper limit value of the laser power is preferably 100 W, more preferably 10 W, and still more preferably 5 W, and most preferably 1 W. Meanwhile, the lower limit value of the laser power is preferably 0.1 mW, more preferably 0.5 mW, and still more preferably 1 mW.

It is preferable that the laser beam excels in oscillation wavelength and coherency, and that the laser beam can be condensed to a spot size which is as small as the wavelength of the laser beam. Further, as a light exposure strategy (i.e., optical pulse illumination conditions for appropriately forming a pattern of recessed portions 13), it is preferable that the strategy used for optical discs is employed. To be more specific, conditions required for the manufacture of optical discs, such as light exposure speed, peak value of the illuminating laser beam, and pulse width, are preferably used.

The upper limit value of the thickness of the photoresist layer 12 is preferably 1 micrometer or less, more preferably 0.5 micrometer or less, and particularly preferably 0.3 micrometer or less. The lower limit value of the thickness of the photoresist layer 12 is preferably 0.01 micrometer or more, more preferably 0.03 micrometer or more, and particularly preferably 0.05 micrometer or more.

After the photoresist forming step described above is complete, a mold 1 is set in the processing device 2 shown in FIG. 1. Thereafter, while the mold 1 is rotated and the head 22A is moved along the product forming surface 11 of the mold 1 under a focus servo control, a laser beam from the head 22A is applied appropriately to the photoresist layer 12, whereby a pattern of recesses 13 is formed in appropriate positions on the photoresist layer 12, as shown in FIG. 2 (b) (laser beam illumination step).

To be more specific, when the photoresist layer 12 is illuminated with a laser beam having a wavelength such that the material has light absorption (i.e., the wavelength of light to be absorbed in the material), the laser beam is absorbed by the photoresist layer 12, and then converted into heat to thereby increase the temperature at an illuminated portion thereof. This causes the photoresist layer 12 to undergo chemical or/and physical change(s) such as softening, liquefaction, vaporization, sublimation and decomposition. Thus-changed materials move or/and dissipate, and are removed from the product forming surface 11 of the mold 1, so that a pattern of recessed portion 13 is formed.

It is noted that when the heat mode-type photoresist layer 12 is illuminated with the laser beam, a change of the material occurs only in a part of the illuminated portion which reaches the transition temperature. Since the light intensity is greatest at the center in cross section of the laser beam and is gradually attenuated toward the edge of the laser beam, a minute hole (laser spot) having a diameter smaller than the spot diameter of the laser beam can be formed in the photoresist layer 12.

The output value of the laser beam emitted from the head 22A, or the like is set appropriately at a value such that the product forming surface 11 of the mold 1 is exposed by relatively short-time laser beam illumination. The spot diameter of the laser beam is set appropriately at a value such that the widths (half-value widths) of recessed portion patterns 13 are 1 micrometer or less. Herein, the half-value width indicates the width of the recessed portion pattern 13 at a half of the depth thereof.

As a specific example of an exposure device 22, NE500 manufactured by Pulstec Industrial Co., Ltd. (wavelength: 405 nm; NA: 0.85) can be used. Further, as a method for forming a pattern of recessed portions 13, a pit forming method, for example, as known in the realm of a write-once optical or WORM disc is applicable. To be more specific, for example, the known Running OPC technique (e.g., Japanese Patent No. 3096239, Paragraph [0012]) can be applied in which a reflected light intensity of the laser beam that varies in accordance with the pit size is detected, and the output of the laser is corrected so that the reflected light intensity becomes constant to thereby form uniform sized pits.

Figure 3:
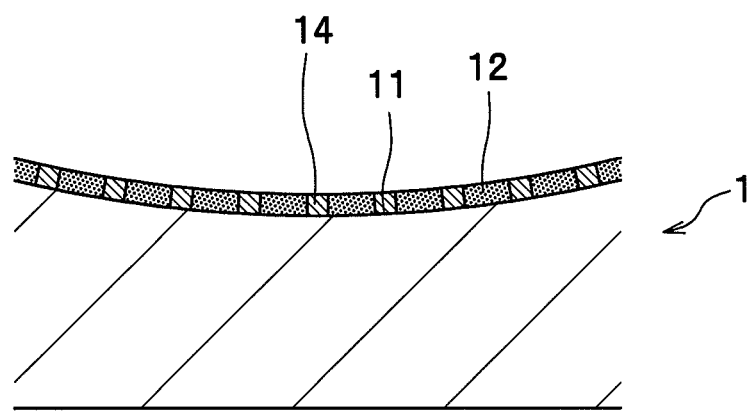
FIG. 3 includes (a) a sectional view showing a plating treatment, and (b) a sectional view showing a photoresist layer removing treatment.
Figure 3:
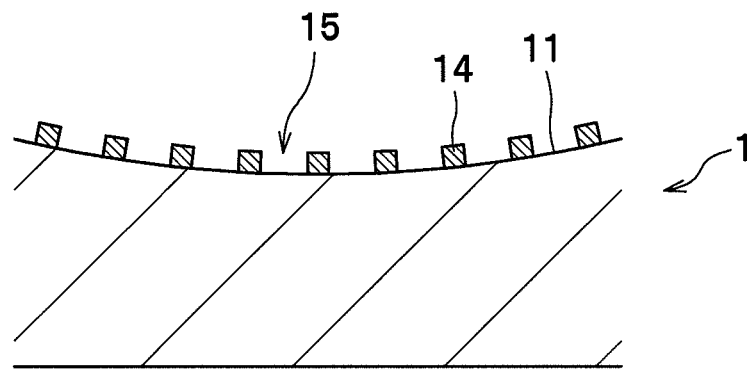

After a pattern of recessed portions 13 is formed in the photoresist layer 12, the mold 1 is put into a plating bath (not shown), so that a plating film 14 is let grow on the product forming surface 11 of the mold 1, as shown in FIG. 3 (a). Thereafter, the photoresist layer 12 is removed with a cleaning liquid such as ethanol, so that a pattern of asperities 15 of the plating film 14 is formed on the product forming surface 11 of the mold 1, as shown in FIG. 3 (b) (asperity forming step). Materials for the plating film applicable may include nickel, chrome, cobalt, molybdenum, aluminum, titan, or the like.

The asperity forming step as described above is performed over the entire surface of the product forming surface 11 of the mold 1, so that the mold 1 having a fine pattern of asperities 15 is manufactured. Furthermore, an optical component having fine asperities is manufactured by injection molding using the mold 1 manufactured in such a manner as described above.

Based on the above-described features, in the present embodiment, the following advantageous effects can be achieved.

Since a fine pattern of recessed portions 13 each having a diameter smaller than a spot size of a laser beam is formed by applying the laser beam to a thermally deformable heat-mode photoresist layer 12, fine asperities (e.g., asperities submicron in size) can be formed adequately on a product forming surface 11 with a plating film in the subsequent asperity forming step.

Since a typically used semiconductor laser has a wavelength of 405 nm or so at the shortest, it cannot form so fine asperities as a solid-state laser having a shorter wavelength can form; however, the use of a thermally deformable heat-mode photoresist layer enables the semiconductor laser to form fine asperities.

Since the surface of the photoresist layer 12 over the product forming surface 11 and an optical axis along which the laser beam travels are always made perpendicular to each other, and thus a position of a focal point of the laser beam emitted from the head 22A can be set accurately at a predetermined position in the photoresist layer 12, a desirable pattern of recessed portions 13 can be formed on the photoresist layer 12.

Since the laser beam is focused on a predetermined position relative to the photoresist layer 12 by exercising a focus servo control, a spot size of the laser beam applied to the surface of the photoresist layer 12 can be made uniform, so that recessed portions can be formed uniformly.

Since the head 22A is configured to be swingable along the product forming surface 11 in such a manner that the optical axis along which the laser beam travels and the surface of the portion to be processed of the photoresist layer 12 intersect substantially perpendicularly with each other, the focus servo control can be exercised adequately, and a desirable pattern of recessed portions 13 can be formed.

It is to be understood that the present invention is not limited to the above-described embodiment, but can be utilized in various embodiments as will be described by way of example.

In the above-described embodiment, a pattern of recessed portions 13 is formed on the photoresist layer 12, then subjected to a plating treatment, and the photoresist layer 12 is removed therefrom to form a fine pattern of asperities on the product forming surface 11 of the mold 1, but the present invention is not limited thereto. For example, as shown in FIGS. 4 (a)-(c), a film of chrome 3 is formed by evaporation or sputtering to thereby form a fine pattern of asperities on the product forming surface 11.

Figure 4:
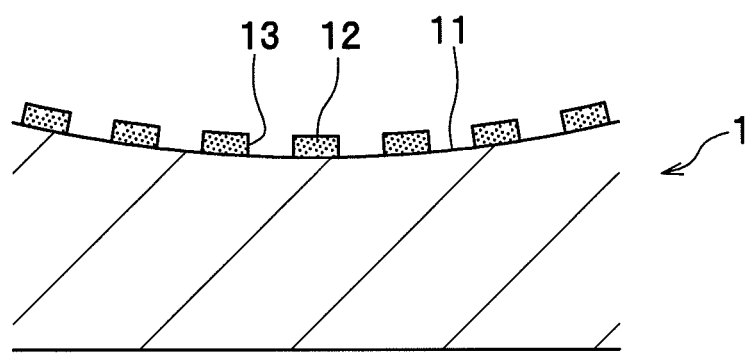
FIG. 4 includes sectional views showing a mode of asperity pattern formation on a product forming surface by vapor deposition or sputtering, wherein (a) is a sectional view showing a state in which a pattern of recessed portions is formed on a photoresist layer, (b) is a sectional view showing a chrome-plated state of an outer surface of the photoresist layer and the product forming surface, and (c) is a sectional view showing a state in which the photoresist layer is removed from the product forming surface.
Figure 4:
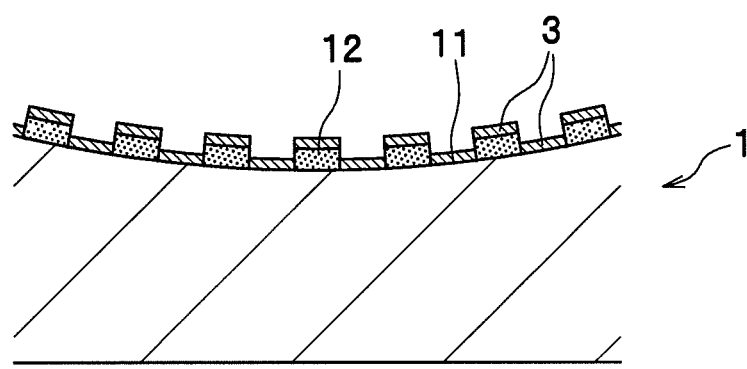
Figure 4:
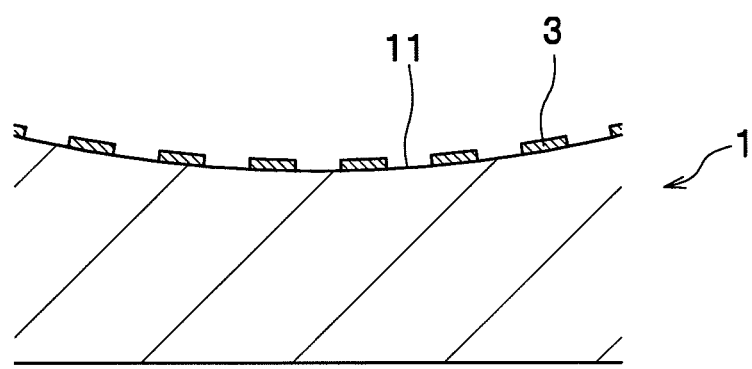

To be more specific, in this method, as shown in FIG. 4 (a), a pattern of recessed portions 13 is formed on the photoresist layer 12 and thereafter the mold 1 is put into a vacuum chamber (not shown); then, as shown in FIG. 4 (b), chrome 3 as one example of metal material is formed on the product forming surface 11 of the mold 1. Thereafter, the photoresist layer 12 is removed with a cleaning liquid as in the above-described embodiment, so that a pattern of chrome 3 is formed on the product forming surface 11 of the mold 1 as shown in FIG. 4 (c) (asperity forming step). In this method as well, a fine pattern of asperities can be formed adequately on the product forming surface 11 of the mold 1. As a metal material to be used for evaporation or sputtering, any material other than chrome 3 can be adopted, such as nickel, cobalt or molybdenum.

Figure 5:
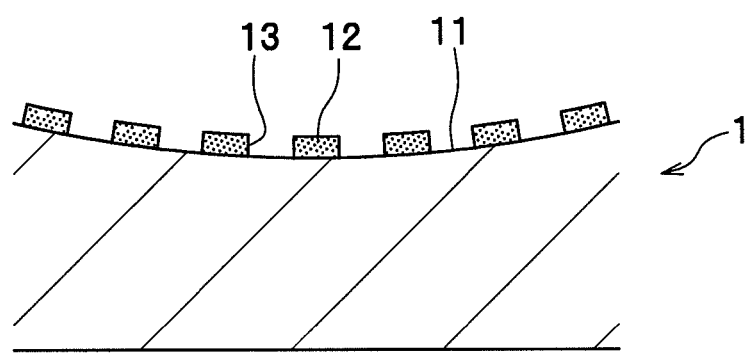
FIG. 5 includes sectional views showing a mode of asperity pattern formation on a product forming surface by etching, wherein (a) is a sectional view showing a state in which a pattern of recessed portions is formed on a photoresist layer, (b) is a sectional view showing a state in which the product fanning surface is etched, and (c) is a sectional view showing a state in which the photoresist layer is removed from the product forming surface.
Figure 5:
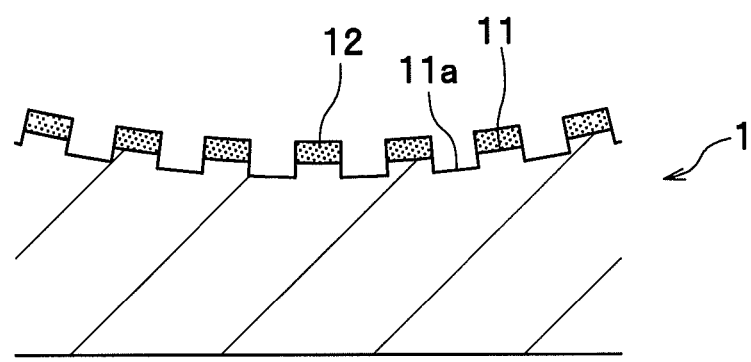
Figure 5:
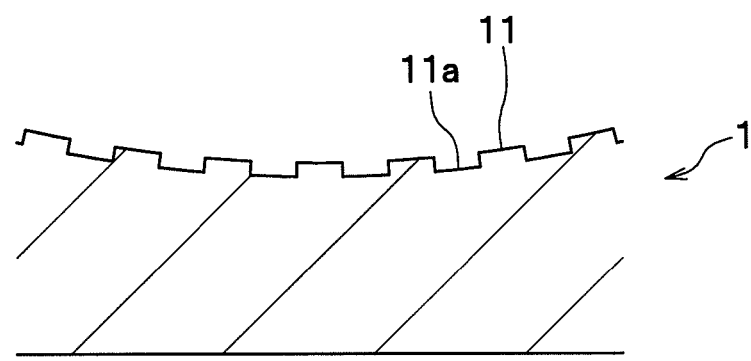

Alternatively, as shown in FIGS. 5 (a)-(c), a fine pattern of asperities may be formed on the product forming surface of the mold 1 by etching.

To be more specific, in this method, as shown in FIG. 5 (a), a pattern of recessed portions 13 is formed on the product forming surface 11 and thereafter etching is performed using as a mask the photoresist layer 12 remaining on the product forming surface 11 of the mold 1, so that recessed portions 11a are formed on the product forming surface 11 of the mold 1 as shown in FIG. 5 (b). The etching performed herein may adopt various etching methods which include wet etching, dry etching, RIE (reactive ion etching), or the like.

After the recessed portions 11a are formed, the photoresist layer 12 is removed with a cleaning liquid as in the above-described embodiment, so that a pattern (of recessed portions 11a) made by etching is formed on the product forming surface 11 of the mold 1 (asperity forming step). In this method as well, a fine pattern of asperities can be formed adequately on the product forming surface 11 of the mold 1.

Figure 6:
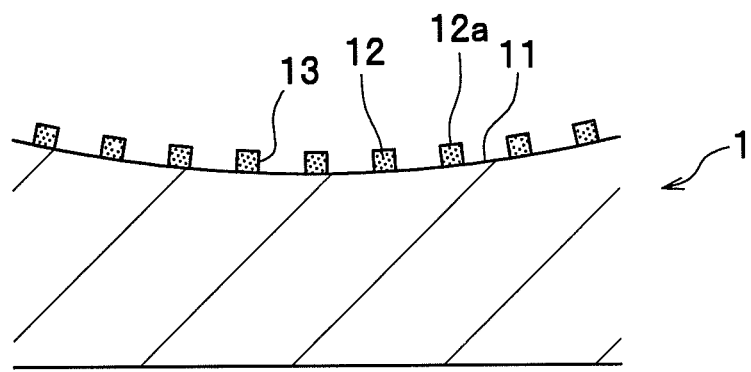
FIG. 6 includes sectional views showing a mode of asperity pattern formation by forming a film of a metal material continuously on an outer surface of a photoresist layer and a product forming surface, wherein (a) is a sectional view showing a state in which a pattern of recessed portions is formed on the photoresist layer, and (b) is a sectional view showing a state in which the film of metal material is formed continuously on the outer surface of the photoresist layer and the product forming surface.
Figure 6:
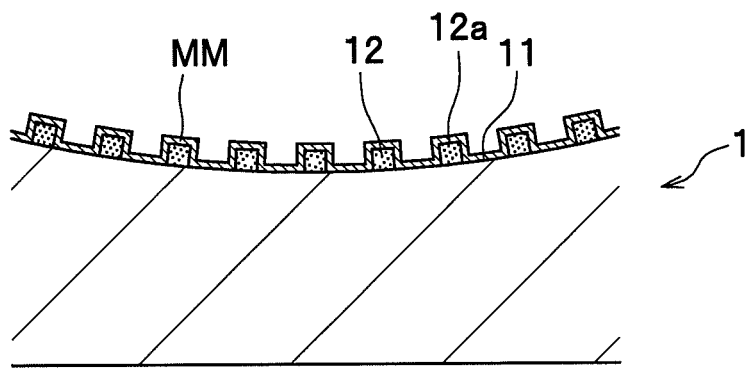

Alternatively, as shown in FIGS. 6 (a), (b), a film of metal material MM may be formed continuously on the outer surface 12a of the photoresist layer 12 on which the recessed patterns 13 are formed and the product forming surface 11 of the mold 1, to thereby form a fine pattern of asperities on the product forming surface 11 of the mold 1. In this embodiment, the pattern of asperities can be formed, without removal of the photoresist layer 12 remaining on the product forming surface 11 of the mold 1 after evaporation or sputtering as required in the embodiment shown in FIG. 4, and thus the necessity for equipment or the like for removing the photoresist layer 12 can be obviated, and the manufacturing cost can be reduced. In order to form a film of metal material MM continuously as shown in FIG. 6 on the outer surface 12a of the photoresist layer 12 and the product forming surface 11 of the mold 1, sputtering may preferably adopted. In order to form a film of metal material (chrome 3) discontinuously as shown in FIG. 4 thereon, evaporation may preferably be adopted. Furthermore, in the embodiment shown in FIG. 6, a pattern of recessed portions 13 does not have to be formed until the product forming surface 11 of the mold 1 is exposed to view. That is, even if the product forming surface 11 is covered at the bottoms of the pattern of recessed portions 13, a pattern of asperities composed of metal material MM can be formed.

Figure 7:
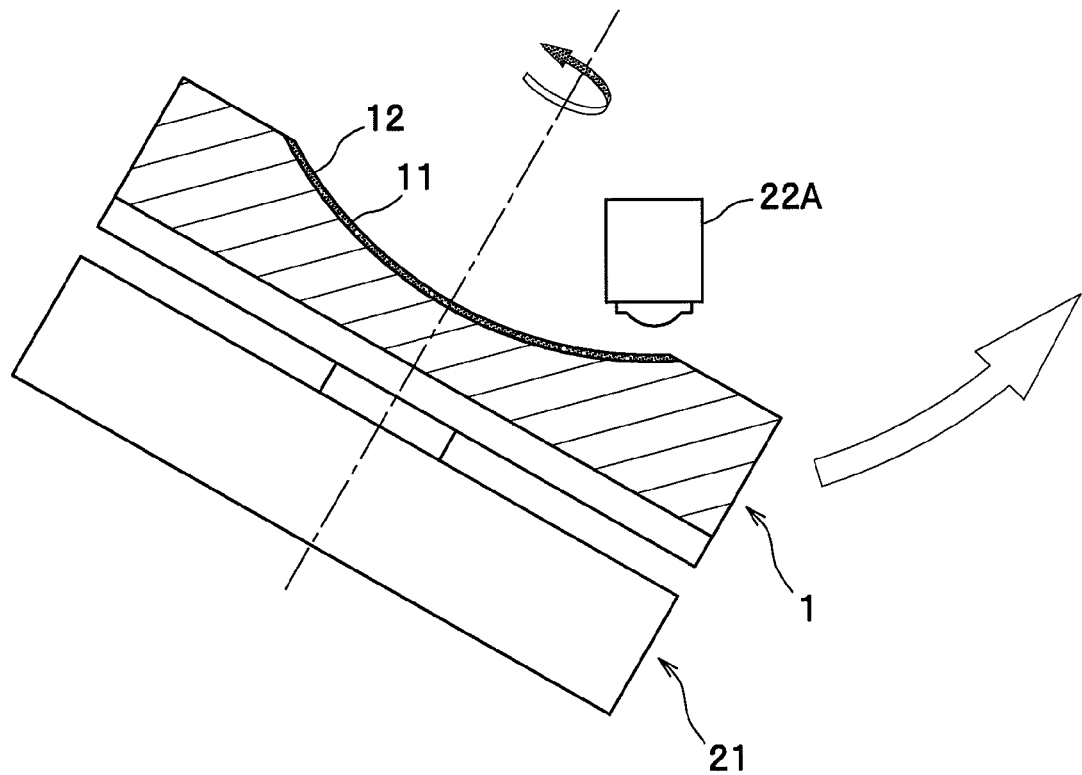
FIG. 7 is a side view showing a mode in which a swinging motion is imparted a rotator along a product forming surface.

In the above-described embodiment, the mold 1 is rotated and the head 22A is swung along the radial direction of the product forming surface 11, to cause the head 22A emitting a laser beam and the mold 1 to move relative to each other along the concave product forming surface 11, but the present invention is not limited thereto. For example, as shown in FIG. 7, the rotator 21 for rotating the mold 1 may be swung about the center of the product forming surface 11 so as to move along the product forming surface 11 relative to the immovable head 22A.

Figure 8:
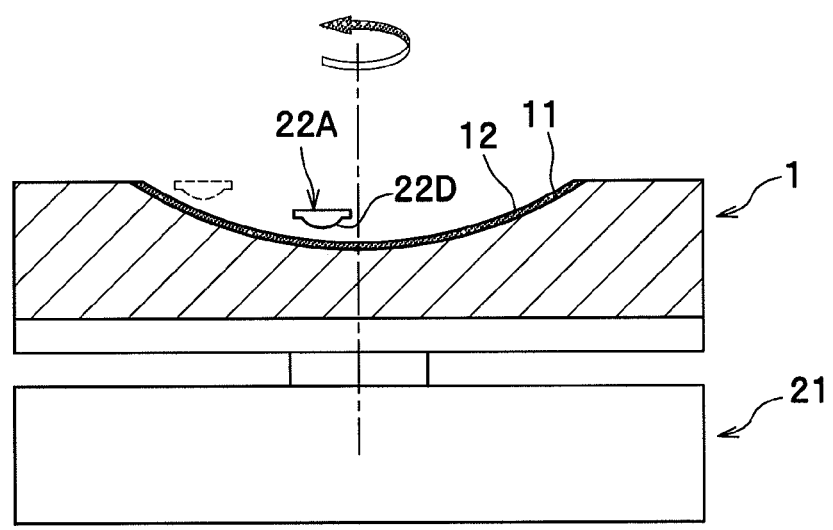
FIG. 8 is a side view showing a mode in which no swinging motion is imparted to a head, but an upward-downward motion, under focus servo control, is imparted thereto.

In the above-described embodiment, the head 22A is moved while being tilted so that the surface of the photoresist layer 12 over the product fowling surface 11 and the optical axis along which the laser beam travels always intersect at right angles with each other, but the present invention is not limited thereto. For example, as shown in FIG. 8, in cases where the product forming surface 11 is configured to be shallow, the head 22 may be moved in a radial direction of the product forming surface 11 while the lens surface 22A of the head 22 is moved upward and downward under a focus servo control, so that the head 22A is moved along the product forming surface 11. However, it is to be understood that the above-described embodiment in which the head 22 is tilted so that the surface of the photoresist layer 12 and the optical axis along which the laser beam travels always intersect at right angles with each other may be more preferable in that this can obtain a more adequately formed pattern of recessed portions 13. The results of formation of a pattern of recessed portions 13 obtained by these different methods will be shown in the following examples.

EXAMPLES

In the implementation example, a mold 1 similar to that described in the above embodiment was fabricated. The mold 1 was fabricated of a substrate of SUS, and a spherical product forming surface 11 having a depth of 0.5 mm and a diameter of 20 mm was formed at its center. On the product forming surface 11, a dye layer (photoresist layer 12) having a thickness of 100 nm was formed, and recessed portions each having a diameter of 300 nm were formed by a laser beam.

Details of each layer were as follows.
Substrate
Material: SUS
Thickness: 0.6 mm
Outer diameter: 120 mm
Inner diameter: 15 mm
Dye Layer (Photoresist Layer)
2 g of a dye material given by the following formula was dissolved in 100 ml of TFP (tetrafluoropropanol) solvent, and the resulting solution was spin coated. In this spin-coating process carried out with a dispense-start rotation speed of 500 rpm and a dispense-end rotation speed of 1,000 rpm, a coating liquid was dispensed onto the inner-radius area of the substrate, and the rotation speed was gradually increased to 2,200 rpm. The refractive index n of the dye material was 1.986 and the extinction coefficient k of the dye material was 0.0418.

[Chem. 7]

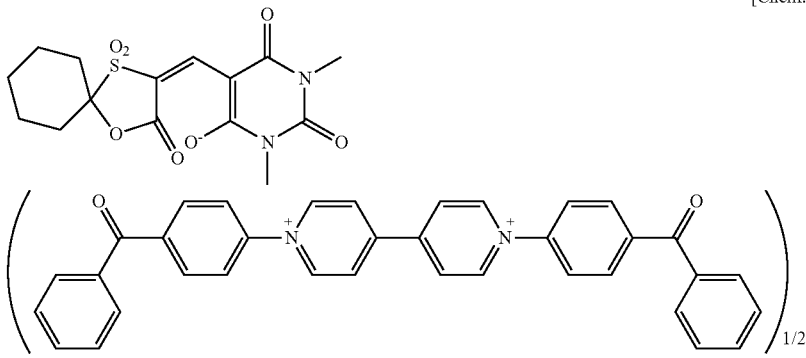

In the above photoresist layer 12, fine recessed portions were formed using NEO1000 (wavelength: 405 nm, NA: 0.85) manufactured by Pulstec Industrial Co., Ltd. The head 22A was moved while being tilted by a motor-driven tilt mechanism in such a manner that the surface of the photoresist layer 12 and the optical axis along which the laser beam traveled were rendered perpendicular with each other.

Conditions for forming the recessed portions were as follows.

Laser output: 3 mW
Linear velocity: 5 m/s
Recording signal: Square wave of 3 MHz When the photoresist layer fabricated as described above was observed by AFM (atomic force microscope), it was observed that recessed portions each having a diameter of 300 nm were formed.

As a comparative example, under the conditions in which only the condition of tilting the head by the motor-driven tilt mechanism was omitted from the above-specified conditions, an experiment was conducted. Comparing this experimental result with the experimental result described above, it was confirmed that the shapes of pits formed in the comparative example became considerably poor and the focus control could not be exercised properly, if the tilt angle of the product forming surface 11 (the angle with respect to the plane perpendicular to the optical axis) was 2 degrees or more.

The invention claimed is:

1. A processing method for a mold, comprising:
   a photoresist forming step of forming a thermally deformable heat-mode photoresist layer on a product forming surface which includes a curved surface and which is formed on the mold, the photoresist layer containing a dye;
   a laser beam illumination step of applying a laser beam to the photoresist layer by an exposure device incorporating a semiconductor laser to form a pattern of recessed portions in the photoresist layer through thermal removal of a photoresist material of the photoresist layer, by heat produced through light absorption of the photoresist material of the photoresist layer caused by application of the laser beam, wherein the laser beam illumination step includes causing a relative curvilinear movement of at least one of a head emitting the laser beam and the mold to thereby move the head along the curved surface relative to the product forming surface, whereby the photoresist layer on the curved product forming surface is scanned with a dot-like spot of the laser beam; and
   an asperity forming step of forming asperities on the product forming surface by making use of the pattern of recessed portions.

2. The processing method for a mold according to claim 1, wherein the laser beam illumination step includes:
   changing an orientation of a head emitting the laser beam, in accordance with an angle of the product forming surface, so as to make a surface of the photoresist layer covering the product forming surface and an optical axis along which the laser beam travels perpendicular to each other.

3. The processing method for a mold according to claim 1, wherein the asperity forming step includes:
   forming a film of metal material on the product forming surface and an outer surface of the photoresist layer, and thereafter removing the photoresist layer, to thereby form the asperities on the product forming surface.

4. The processing method for a mold according to claim 1, wherein the asperity forming step includes:
   putting the mold into a plating bath, letting a plating film grow on the product forming surface, and thereafter removing the photoresist layer, to thereby form the asperities on the product forming surface.

5. The processing method for a mold according to claim 1, wherein the asperity forming step includes:
   etching using as a mask the photoresist layer remaining on the product forming surface, and thereafter removing the photoresist layer, to thereby form the asperities on the product forming surface.

6. The processing method for a mold according to claim 1, wherein the asperity forming step includes:
   forming a film of metal material continuously on the product forming surface and an outer surface of the photoresist layer to thereby form the asperities on the product forming surface.

7. The processing method for a mold according to claim 1, wherein the laser beam illumination step includes:
   exercising a focus servo control such that the laser beam is focused on a predetermined position relative to the photoresist layer.

8. The processing method for a mold according to claim 1, wherein the pattern of recessed portions has widths of 1 micrometer or less.

9. A manufacturing method for an optical component, wherein the optical component is manufactured by injection molding using a mold processed by the processing method according to claim 1.

10. The processing method for a mold according to claim 1, wherein the pattern of recessed portions is formed through thermal deformation of a photoresist material of the photoresist layer, by heat produced through light absorption of the photoresist material caused by application of the laser beam in the laser beam illumination step.

11. The processing method for a mold according to claim 10, wherein the pattern of recessed portions is formed directly by application of the laser beam illumination.

12. The processing method for a mold according to claim 1, wherein the pattern of the recessed portions including removal of portions of the photoresist material is formed directly by application of the laser beam illumination.

13. The processing method for a mold according to claim 2, wherein the laser beam illumination step further includes obtaining information as to a shape of the curved product forming surface, and controlling the orientation of the head based upon the obtained information.

14. The processing method for a mold according to claim 13, wherein the obtaining the information on the shape of the curved product forming surface includes using a shape detection device of a non-contact type.

15. The processing method for a mold according to claim 13, wherein the obtaining the information on the shape of the curved product forming surface includes acquiring the shape of a workpiece from mechanical specifications thereof.

16. The processing method for a mold according to claim 1, further comprises a shape acquisition step of acquiring information on a shape of the curved product forming surface for use in the laser beam illumination step.

* * * * *